United States Patent [19]

Michener

[11] Patent Number: 4,603,366

[45] Date of Patent: Jul. 29, 1986

[54] HIGH-SPEED VOLTAGE-SENSITIVE CIRCUIT BREAKER

[75] Inventor: John R. Michener, Princeton, N.J.

[73] Assignee: Siemens Corporate Research & Support, Inc., Iselin, N.J.

[21] Appl. No.: 630,465

[22] Filed: Jul. 12, 1984

[51] Int. Cl.⁴ .............................................. H02H 3/24
[52] U.S. Cl. ......................................... 361/56; 361/92
[58] Field of Search ..................... 361/56, 57, 90, 92, 361/100, 101, 54, 55, 88

[56] References Cited

U.S. PATENT DOCUMENTS 3,579,036  5/1971  McCoy .................................. 361/57

FOREIGN PATENT DOCUMENTS 1139193  11/1962  Fed. Rep. of Germany ........ 361/90

Primary Examiner—A. D. Pellinen
Assistant Examiner—H. L. Williams
Attorney, Agent, or Firm—John Francis Moran

[57] ABSTRACT

A bistable multivibrator circuit responds to the voltage across a device to be protected. The circuit changes its state when this voltage drops below a predetermined value.

11 Claims, 4 Drawing Figures

HIGH-SPEED VOLTAGE-SENSITIVE CIRCUIT BREAKER

BACKGROUND OF THE INVENTION

The invention relates to circuit breakers, and more particularly to high-speed circuit breakers.

In testing power GaAs MESFETs, it is necessary to identify the location of a failure to discover the causes of the failure. However, these devices fail catastrophically in an extremely short time. For example, after a GaAs MESFET begins to short, the damage will be so extensive after a few tens of nanoseconds or less that no information can be obtained on the location of or reason for the failure. To analyze the failed device, it is necessary that power be turned off as fast as possible after the failure begins.

It is known to protect a device using a crowbar circuit which essentially shorts across the device under overload conditions, thereby shunting power away from the device. This has been accomplished by using, e.g., SCR's. However, a crowbar circuit using an SCR as the shorting device is not fast enough to protect a GaAs MESFET because an SCR has a response time measured in microseconds, rather than in nanoseconds.

An object of the present invention is to provide a circuit breaker which can trip within tens of nanoseconds or less after an overload condition has been detected.

Another object is to provide such a circuit breaker which can momentarily absorb high currents.

Yet another object is to provide a cost-effective, high-speed circuit breaker.

Yet still another object is to generally improve on known devices.

SUMMARY OF THE INVENTION

In accordance with the invention, there is provided a bistable multivibrator circuit which responds to the voltage potential at one terminal of the device to be protected. The circuit changes its state from a first state to a second state when the voltage potential at one terminal of the device drops below a predetermined value.

Because such a circuit can be made to operate rapidly, it is possible to induce such a change of state well before a device such as an SCR can be turned off. Advantageously, the circuit utilizes a high-speed output transistor with its collector connected to one side of the device and its emitter in circuit with the other side. In this way, the circuit itself is used as a crowbar and shunts current around the protected device.

Advantageously, other devices, such as electronic switches, can be connected to respond to the state of the circuit to protect the circuit itself from damage after the device has failed and been protected.

BRIEF DESCRIPTION OF THE DRAWINGS

Illustrative and non-limiting preferred embodiments of the invention are shown in the drawings, in which.

DETAILED DESCRIPTION OF PREFERRED EMBODIMENTS

Figure 1:
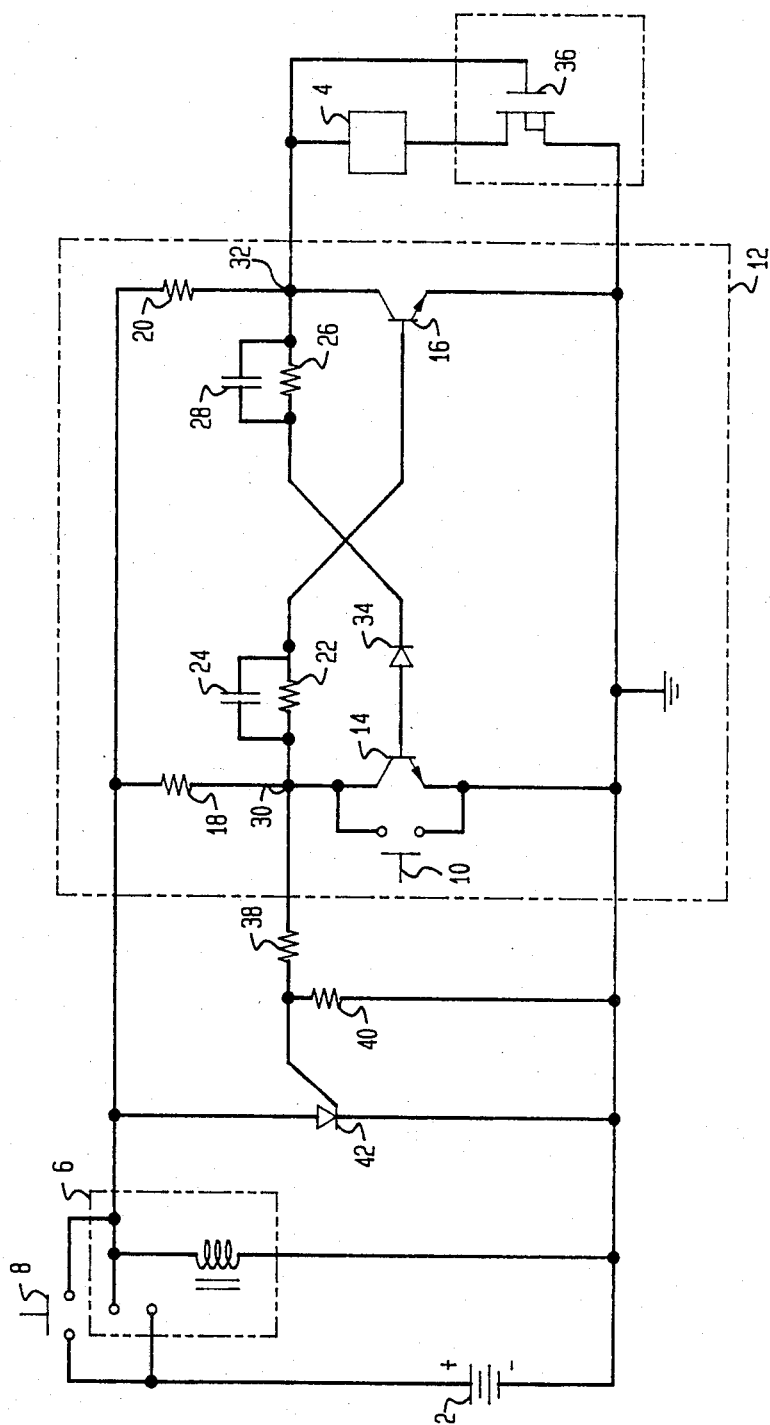
FIG. 1 is a schematic diagram of a first preferred embodiment of the invention.

The same element is indicated by the same reference numeral throughout all the Figures.

Referring first to FIG. 1, the circuitry illustrated is powered by a DC source 2 and is used for testing a semiconductor device 4. The source 2 may be variable to allow a range of voltages to be applied to the device 4. It is desired to turn off the device 4 as soon as possible after it starts to short, and no later than a few tens of nanoseconds after the short begins. The device 4 need not be a single semiconductor device and may be any electrical apparatus which is to be protected very rapidly after it begins to fail.

The voltage source 2 supplies power to an SPST relay 6. The relay 6 is connected in a self-latching configuration and its terminals are bridged by a momentary switch 8. When the switch 8 is closed, current flows through the relay 6 and closes its contacts, which then remain closed without regard to the state of the switch 8.

At the same time that the switch 8 is closed, another momentary contact switch 10 is also closed. The two switches 8 and 10 may be ganged or a part of a DPST switch, but this is not required and is not part of the invention. The switch 10 initializes the state of a bistable multivibrator circuit generally indicated by reference numeral 12. As will be seen below, the circuit 12 changes its state when the device 4 starts to fail, and this change of state is used to protect the device 4 and also to protect the circuit 12.

The operation of the circuit 12 will now be described. The circuit 12 uses two NPN transistors 14 and 16 which are connected in a conventional flip-flop configuration. The collector of the transistor 14 is connected to power through a resistor 18 and the collector of the transistor 16 is connected to power through a resistor 20.

The emitters of the transistors 14 and 16 are grounded. The base circuit of the transistor 16 contains a resistor 22 in parallel with a capacitor 24; the base circuit of the transistor 14 contains a resistor 26 in parallel with a capacitor 28. The resistor 18, capacitor 24, resistor 22, and collector of the transistor 14 are all connected to a circuit point 30; another circuit point 32 is a common junction point of the resistor 20, resistor 26, capacitor 28, and the collector of transistor 16.

When the switch 10 is closed (i.e. when the circuit 12 is initialized), the transistor 14 is turned on and the transistor 16 is turned off. This is because there is insufficient voltage at the circuit point 30 to cause current flow from the base to the emitter of transistor 16. Since such current flow does not exist, the transistor 16 is turned off and the voltage at the circuit point 32 is thus high. The values of the components are selected so that under these circumstances, there is a current flow in the base circuit of the transistor 14. This base circuit also contains a TRANSZORB transient voltage suppressor 34, which in this case is used to prevent the transistor 14 from turning off except under the circumstances set forth below. Suitable fast-acting transient voltage suppressors are readily available from General Semiconductor Industries, Inc. located in Tempe, Ariz.

The device 4 is connected between the circuit point 32 and ground via FET 36 whose function will be discussed later. When the device 4 begins to fail by shorting, the voltage at the circuit point 32 decreases. When this voltage drops below the sum of the voltage drops across the transient voltage suppressor 34 and the base-emitter junction of the transistor 14, the transistor 14 turns off and the voltage at the circuit point 30 rises. This in turn turns on the transistor 16, lowering the voltage of the circuit point 32 so that the transistor 16 provides a shunt current path between the hot side of the device 4 and ground, and acts as a crowbar.

In some cases, the crowbar action thus described will be adequate to protect the device 4. However, there is a voltage drop between the collector and the emitter of transistor 16 and even when the transistor 16 is turned fully on, there can still be some current flowing through the device 4. To prevent this, the source and drain of an NMOS FET 36 or other electronic switch is connected in series with the device 4, the gate of the FET 36 being connected to the circuit point 32. An NMOS FET remains off unless its gate has a potential of at least three volts, so as soon as the circuit point 32 drops below this voltage, the source-drain current in the FET 36 will be cut off and the device 4 will be completely protected.

To achieve the desired switching speed, the transistors 14 and 16 should be very fast. Suitable components are MSC 82010 silicon power bipolar pulsed radar transistors. These can turn on as quickly as five or ten nanoseconds. The capacitors 24 and 28 (known to those skilled in the art as feedforward or speed-up capacitors increase the switching speed of the circuit 12 by dumping energy into their appropriate base circuits to increase the turning on speed of their respective transistors 14 and 16.

When the circuit 12 has changed state (i.e. when transistor 14 has turned off, transistor 16 has turned on, and the voltage across the device 4 reduced to zero or a slightly higher value) the circuit point 30 reaches a higher voltage than it had when the circuit was first turned on because the device 4 is now out of the circuit. The voltage at the circuit point 30 is divided across a voltage divider composed of resistors 38 and 40, and the divided voltage is applied to the gate of the SCR 42 to turn the SCR 42 on. This crowbars the coil of the relay 6 and causes its contacts to open, so that the entire circuit is turned off.

It is necessary that the FET 36 turn off more slowly than the transistor 16, or current flow will exist such that the transistor 16 will never turn on. The circuit breaker can be regarded as a series of switches, with each switch being slower than the one before it and being able to handle more power. Thus, the circuit 12 changes state first because the transistors 14 and 16 are the fastest components. This prevents damage to the device 4. After the circuit 12 changes state, the FET 36 turns off, and only afterward does the SCR 42 turn on, followed by the de-energization of the relay 6.

Figure 2:
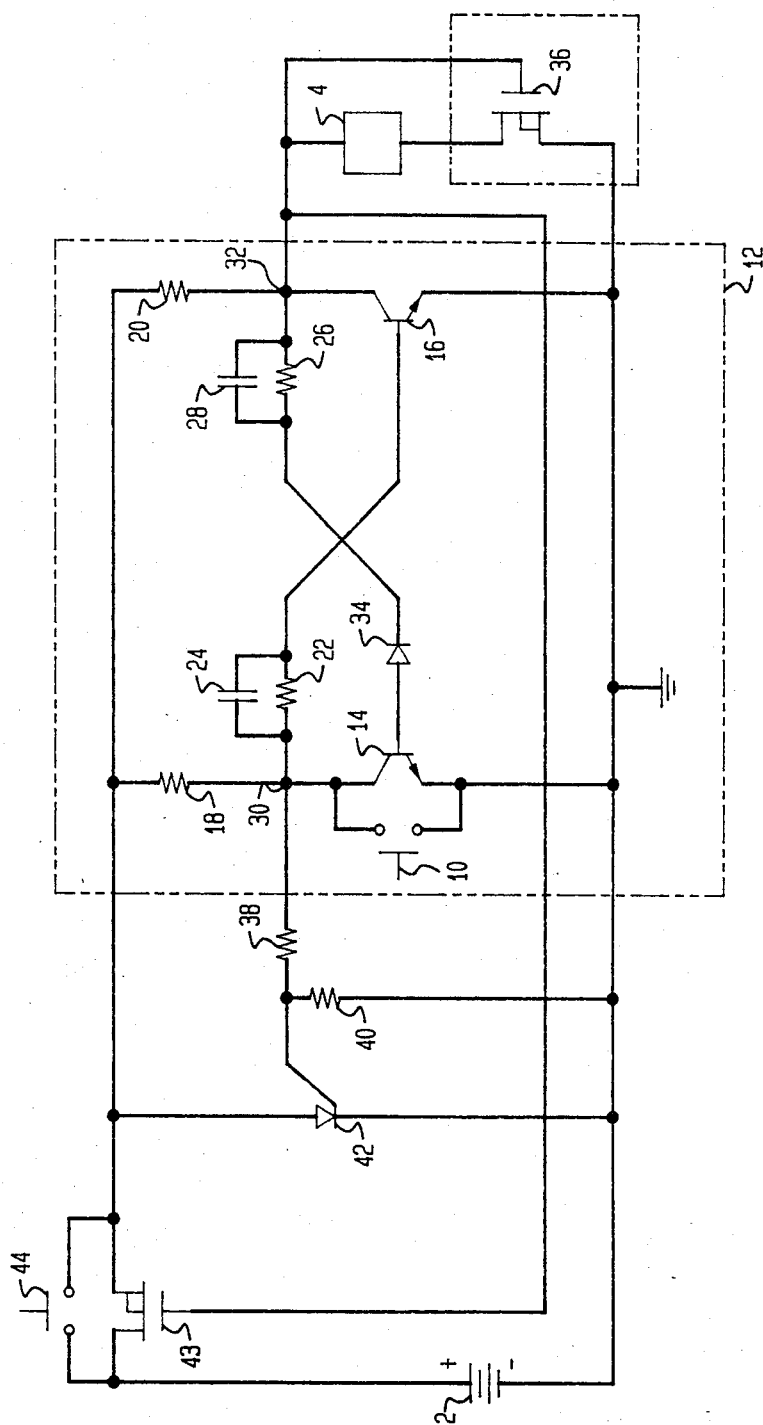
FIG. 2 is a schematic diagram of a second embodiment of the invention with details shown in FIG. 1 omitted therefrom.
Figure 3:
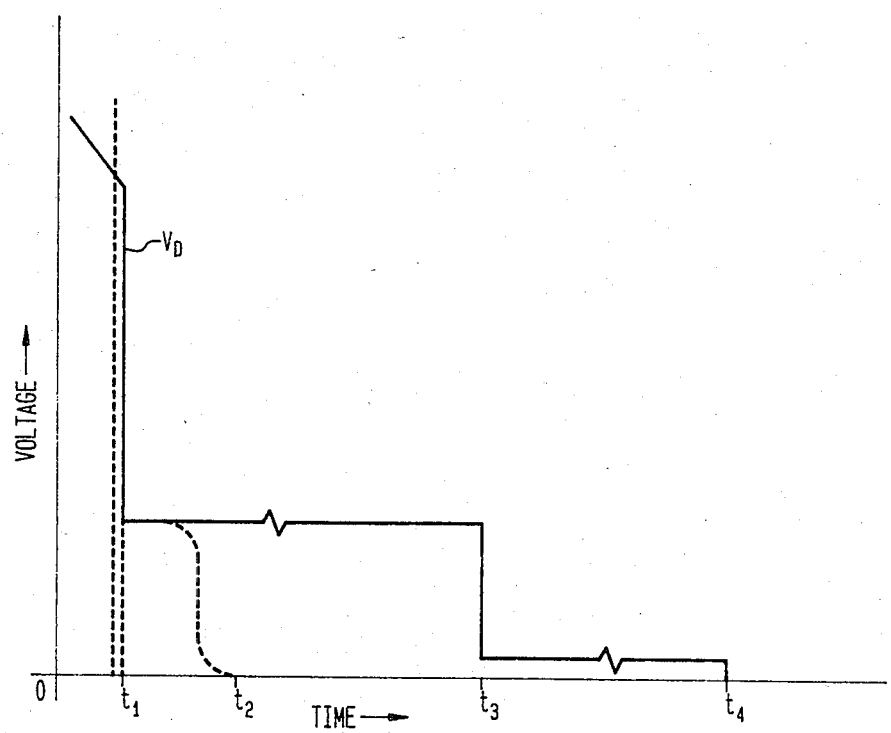
FIG. 3 shows the sequence of operation of the first illustrative embodiment as it relates to the voltage across the device under test.
Figure 4:
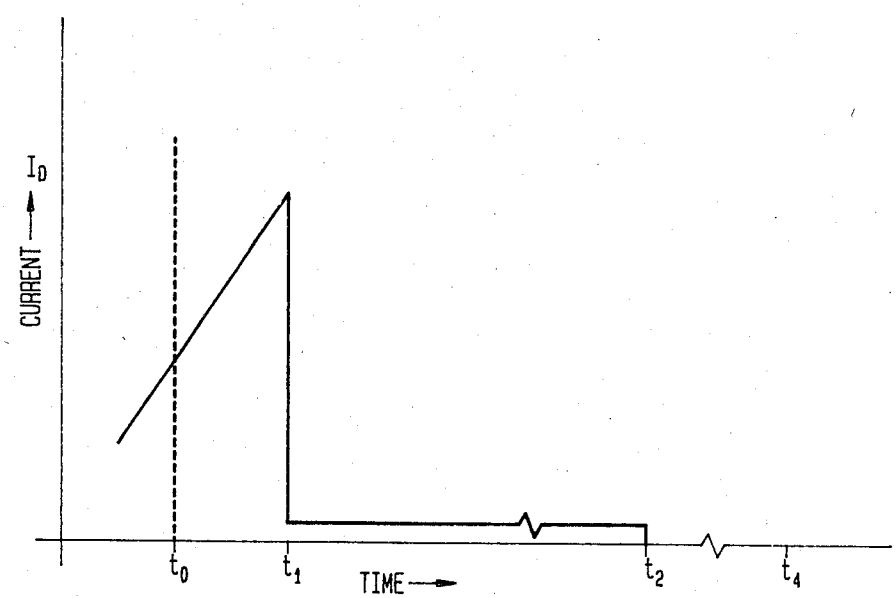
FIG. 4 shows the sequence of operation of the first illustrative embodiment as it relates to the current through the device under test.

The sequence of operation of inventive circuit breaker is shown in FIGS. 3 and 4. The ordinate scale in both of FIGS. 3 and 4 correspond to elapsed time (not shown to scale) during circuit operation. FIG. 3 is a plot of the voltage potential at circuit node 32 while the current through protected device 4 is illustrated in FIG. 4. In FIG. 3, the circuit 12 changes state in the interval of $t_0$ to $t_1$, which typically corresponds to approximately 10 to 20 nanoseconds. Next, FET 36 operates by becoming nonconductive in the interval of $t_1$ to $t_2$ which usually takes between 50 to 100 nanoseconds. Finally, relay 6 unlatches in the interval of $t_3$ to $t_4$ which may take between one to 10 milliseconds. FIG. 4 illustrates current flow through device 4 during the state change of circuit 12 and then during the time in which FET 36 opens. As shown in FIG. 2, the relay 6, SCR 42 and associated circuitry can be replaced by a MOSFET 43 and switch 44 with its gate connected to circuit point 32 and its source and drain being in series with the battery 2 and the rest of the circuitry. In this case, power to the entire circuit is turned off at same time as when the voltage at the circuit point 32 would drop sufficiently to turn off the FET 36. Thus, the use of MOSFET 43 eliminates the need for the FET 36 since it is much faster acting than relay 6.

Other components can be substituted for the ones here set forth. For example, a Zener diode may be substituted for the transient voltage suppresor 34, and the transistors 14 and 16 need not be of the bipolar type. It is possible to use, e.g. a Triac instead of the SCR 42, and other substitutions can also be made while employing the inventive principles to advantage.

Those skilled in the art will understand that changes can be made in the preferred embodiments here described, and that these embodiments can be used for other purposes. Such changes and uses are within the scope of the invention, which is limited only by the claims which follow.

What is claimed is:

1. A high-speed voltage-sensitive circuit breaker for protecting a device, comprising a bistable multivibrator circuit responsive to a voltage potential present at one terminal of the device to be protected, said circuit changing its state from a first state to a second state when said voltage potential drops below a predetermined value to provide a high-speed current path shunting the device.

2. The circuit breaker of claim 1, wherein said circuit includes a high-speed output transistor with its collector connected to one side of the device and its emitter connected is connected in circuit with another side of the device.

3. The circuit breaker of claim 2, wherein said circuit further includes a high-speed driver transistor connected in flip-flop configuration with the output transistor and having in its base circuit an electrical network which is conductive only when said voltage exceeds said predetermined value.

4. The circuit breaker of claim 3, wherein said network includes an electronic device drawn from a class including:
   (a) Zener diodes; and
   (b) transient voltage suppressor 5. The circuit breaker of claim 3, further including feedforward capacitors in the base circuits of the transistors.

6. The circuit breaker of claim 1, further including a crowbar circuit responsive to the state of said multivibrator circuit to short across a voltage source for the circuit breaker when said voltage drops below said value.

7. The circuit breaker of claim 1, further including an electronic switch placed in series with said device and responsive to the state of said circuit.

8. The circuit breaker of claim 7, wherein the electronic switch is slower than said circuit.

9. The circuit breaker of claim 1, further including an electronic switch responsive to the state of said circuit to disconnect a voltage source for the circuit breaker when said voltage drops below said value.

10. A circuit breaker, comprising:
(a) a bistable multivibrator circuit responsive to a voltage across a device to be protected, said circuit changing its state from a first state to a second state when said voltage drops below a predetermined value;
(b) a first electronic switch responsive to the state of said circuit to reduce power into the circuit from a power source when said voltage drops below said value; and
(c) a second electronic switch placed in series with said device and responsive to the state of said circuit, the switches having slower response times than the bistable multivibrator circuit.

11. The circuit breaker of claim 10, wherein the first electronic switch is slower than the second electronic switch.

* * * * *